United States Patent
Kang et al.

(10) Patent No.: US 9,035,338 B2
(45) Date of Patent: May 19, 2015

(54) ORGANIC LIGHT-EMITTING DISPLAY DEVICE AND METHOD OF MANUFACTURING THE SAME

(75) Inventors: Tae-Wook Kang, Yongin (KR); Young-Seo Choi, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 217 days.

(21) Appl. No.: 13/592,109

(22) Filed: Aug. 22, 2012

(65) Prior Publication Data
US 2013/0181235 A1   Jul. 18, 2013

(30) Foreign Application Priority Data
Jan. 16, 2012 (KR) .................. 10-2012-0004913

(51) Int. Cl.
*H01L 33/00* (2010.01)
*H01L 51/52* (2006.01)

(52) U.S. Cl.
CPC .................... *H01L 51/5253* (2013.01)

(58) Field of Classification Search
USPC ......................... 257/98, 99, 59, 72
See application file for complete search history.

(56) References Cited

U.S. PATENT DOCUMENTS

| | | | |
|---|---|---|---|
| 7,510,913 B2 | 3/2009 | Moro et al. | |
| 7,648,925 B2 | 1/2010 | Moro et al. | |
| 7,727,601 B2 | 6/2010 | Burrows et al. | |
| 2004/0242116 A1* | 12/2004 | Forrest et al. | 445/25 |
| 2007/0049155 A1 | 3/2007 | Moro et al. | |
| 2009/0191342 A1 | 7/2009 | Chu et al. | |
| 2009/0208754 A1 | 8/2009 | Chu et al. | |
| 2010/0156277 A1 | 6/2010 | Visser et al. | |
| 2010/0159792 A1 | 6/2010 | Visser et al. | |
| 2010/0167002 A1 | 7/2010 | Chu et al. | |
| 2011/0042697 A1* | 2/2011 | Lee et al. | 257/89 |

FOREIGN PATENT DOCUMENTS

| | | |
|---|---|---|
| KR | 10-0730220 | 6/2007 |
| KR | 10-0759437 | 9/2007 |

\* cited by examiner

*Primary Examiner* — Tan N Tran
(74) *Attorney, Agent, or Firm* — Robert E. Bushnell, Esq.

(57) ABSTRACT

In an organic light-emitting display device and a method of manufacturing the same, the organic light-emitting display device includes: a substrate; an organic light-emitting unit that includes a plurality of organic light-emitting devices formed on the substrate; and an encapsulation unit that seals the organic light-emitting unit. The encapsulation unit includes: a barrier layer and a planarization layer that are stacked on the organic light-emitting unit; and a cover layer that is disposed between the barrier layer and the planarization layer to cover a crack occurring in each of the organic light-emitting devices.

23 Claims, 2 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 16 Jan. 2012 and there duly assigned Ser. No. 10-2012-0004913.

BACKGROUND OF THE INVENTION

1. Field of the Invention

The present invention relates to an organic light-emitting display device and a method of manufacturing the same.

2. Description of the Related Art

Organic light-emitting display devices using an organic light-emitting device may provide a moving image such as a video because they have a faster response time than liquid crystal display (LCD) devices that are currently widely used, and they may have a wide viewing angle and a high brightness because they emit light by themselves. Accordingly, organic light-emitting display devices are spotlighted as the next-generation display devices.

An organic light-emitting device includes a pixel electrode and a counter electrode facing each other, and an emission layer including an organic material and disposed between the pixel electrode and the counter electrode. When the organic light-emitting device, which is highly vulnerable to moisture, oxygen and light, contacts moisture, oxygen or light, the organic light-emitting device may be degraded. Also, when oxygen or moisture is diffused into the emission layer including the organic material, charges migrate during an electrochemical reaction at an interface between the pixel electrode or the counter electrode and the emission layer including the organic material so as to produce an oxide, and the oxide separates the emission layer including the organic material from the pixel electrode or the counter electrode so as to generate dark spots or the like, thereby reducing the life of the organic light-emitting device. Accordingly, a sealing technology for preventing external moisture, oxygen or light from penetrating into the organic light-emitting device is typically used for the organic light-emitting device.

SUMMARY OF THE INVENTION

The present invention provides an organic light-emitting display device that may prevent damage to the organic light-emitting display device which may occur during a thin film encapsulation process, and a method of manufacturing the organic light-emitting display device.

According to an aspect of the present invention, there is provided an organic light-emitting display device including: a substrate; an organic light-emitting unit that includes a plurality of organic light-emitting devices formed on the substrate; and an encapsulation unit that seals the organic light-emitting unit. The encapsulation unit includes: a barrier layer and a planarization layer that are stacked on the organic light-emitting unit; and a cover layer that is disposed between the barrier layer and the planarization layer so as to cover a crack occurring in each of the organic light-emitting devices.

The cover layer may have a thickness less than the thickness of the planarization layer.

The barrier layer may be formed of an inorganic material.

The planarization layer may be formed of an organic material.

The encapsulation unit may include one or more of the barrier layers and the planarization layers that are alternately stacked.

The cover layer may be formed of an organic material.

The planarization layer may be formed on the cover layer after the cover layer is cured.

The cover layer may be cured by using ultraviolet (UV) rays.

The organic light-emitting display device may further include a buffer layer that is disposed between the organic light-emitting unit and the barrier layer, wherein the buffer layer protects the organic light-emitting device from the UV rays by blocking the UV rays when the cover layer is formed.

The cover layer may have a thickness less than the thickness of the planarization layer.

The organic light-emitting device may include: a first electrode that is formed on the substrate and is exposed by a pixel defining film; an intermediate layer that emits light formed on the first electrode; and a second electrode that is formed to cover the intermediate layer.

The crack may occur when the intermediate layer comes off the pixel defining film.

The intermediate layer may be formed by using laser-induced thermal imaging.

The cover layer may be formed of an acrylic monomer, a silicon-based monomer, an epoxy-based monomer, or a polymer including the above monomers.

According to another aspect of the present invention, there is provided a method of manufacturing an organic light-emitting display device, the method including: forming an organic light-emitting device on a substrate; forming a barrier layer that covers the organic light-emitting device; forming a cover layer on the barrier layer; and forming a planarization layer on the cover layer. The cover layer is formed so as to cover a crack that occurs when the organic light-emitting device is formed.

The cover layer may have a thickness less than the thickness of the planarization layer.

The barrier layer may be formed of an inorganic material.

The planarization layer may be formed of an organic material.

The cover layer may be formed of an organic material.

The cover layer may be formed of an acrylic monomer, a silicon-based monomer, an epoxy-based monomer, or a polymer including the above monomers.

The planarization layer may be formed on the cover layer after the cover layer is cured.

The cover layer may be cured by using ultraviolet (UV) rays.

The method may further include forming a buffer layer to cover the organic light-emitting device before the forming of the barrier layer.

The cover layer may be cured by using UV rays.

The buffer layer may protect the organic light-emitting device from the UV rays by blocking the UV rays when the cover layer is formed.

The forming of the organic light-emitting device may include: forming a first electrode on the substrate; forming a pixel defining film that exposes a surface of the first electrode; forming an intermediate layer that emits light formed on the first electrode; and forming a second electrode that covers the intermediate layer.

The crack may occur when the intermediate layer comes off the pixel defining film.

The intermediate layer may be formed by using laser-induced thermal imaging.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
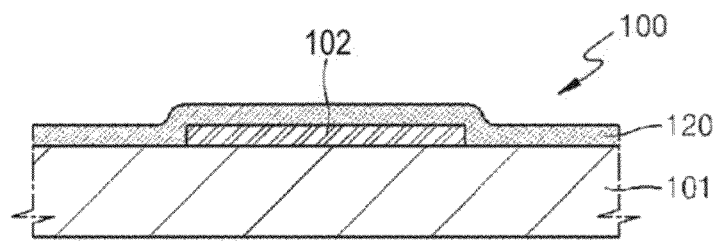
FIG. 1 is a cross-sectional view illustrating an organic light-emitting display device according to an embodiment of the present invention.
Figure 2:
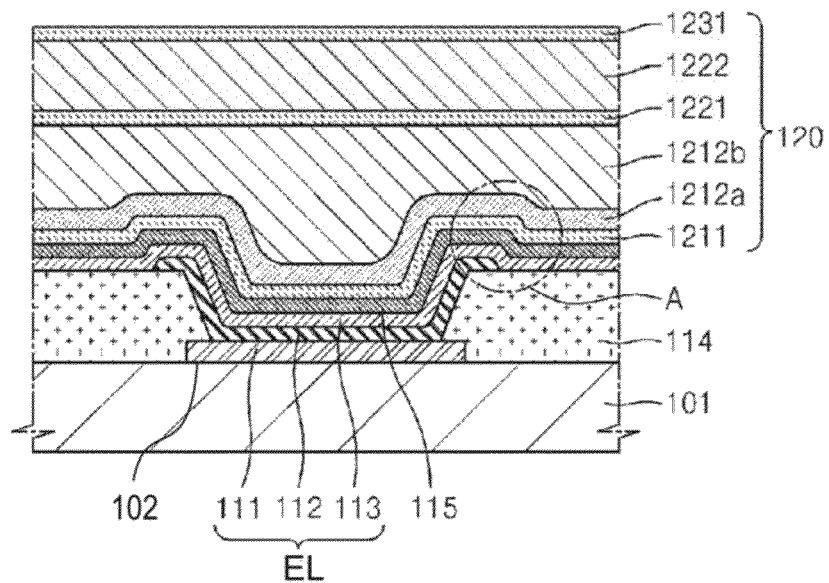
FIG. 2 is a cross-sectional view illustrating an organic light-emitting device of the organic light-emitting display device of FIG. 1.
Figure 3:
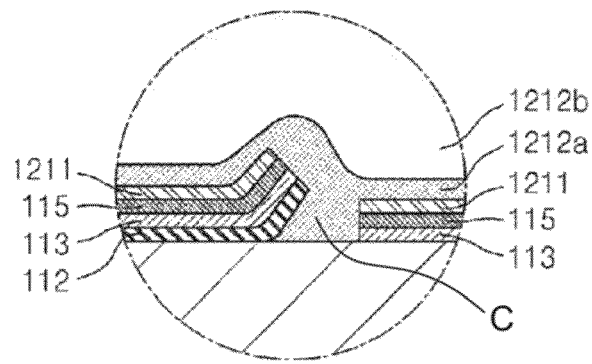
FIG. 3 is an enlarged cross-sectional view illustrating a portion A of FIG. 2.

FIG. 1 is a cross-sectional view illustrating an organic light-emitting display device according to an embodiment of the present invention; FIG. 2 is a cross-sectional view illustrating an organic light-emitting device EL of the organic light-emitting display device of FIG. 1; and FIG. 3 is an enlarged cross-sectional view illustrating a portion A of FIG. 2.

Referring to FIGS. 1 and 2, the organic light-emitting display device 100 includes a substrate 101, an organic light-emitting unit 102, and an encapsulation unit 120.

The organic light-emitting unit 102 including the organic light-emitting device EL is disposed on the substrate 101. The substrate 101 may be a substrate formed of glass material, a substrate formed of plastic material such as polyimide or acryl, or a substrate formed of metal. The substrate 101 maybe a low-temperature polycrystalline silicon (LTPS) substrate. A buffer layer (not shown) may be further disposed on the substrate 101 as desired.

The organic light-emitting unit 102 may include a plurality of the organic light-emitting devices EL. Each of the organic light-emitting devices EL includes a first electrode 111, an intermediate layer 112, and a second electrode 113.

The first electrode 111 and the second electrode 113 may be used as an anode and a cathode, respectively. However, the present embodiment is not limited thereto, and polarities of the first electrode 111 and the second electrode 113 may be switched, and thus the first electrode 111 and the second electrode 113 may be used as a cathode and an anode, respectively.

If the organic light-emitting display device 100 is a bottom emission organic light-emitting display device in which an image is formed toward the substrate 101, the first electrode 111 is a transparent electrode and the second electrode 113 is a reflective electrode. Alternatively, if the organic light-emitting display device 100 is a top emission organic light-emitting display device in which an image is formed toward the encapsulation unit 120, the first electrode 111 is a reflective electrode and the second electrode 113 is a transparent electrode.

The transparent electrode may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The reflective electrode may be formed by thinly depositing a metal having a low work function such as silver (Ag), magnesium (Mg), aluminum (Al), platinum (Pt), palladium (Pd), gold (Au), nickel (Ni), neodymium (Nd) iridium (Ir), chromium (Cr), lithium (Li), LiF/Ca, LiF/Al, and a compound thereof.

A surface of the first electrode 111 is exposed by a pixel defining film 114. The pixel defining film 114, formed of at least one organic insulating material selected from the group consisting of polyimide, polyamide, acrylic resin, benzocyclobutene, and phenol resin, may be formed by using spin coating or the like. Alternatively, the pixel defining film 114 may be formed of an inorganic insulating material selected from the group consisting of $SiO_2$, $SiN_x$, $Al_2O_3$, $CuO_x$, $Tb_4O_7$, $Y_2O_3$, $Nb_2O_5$, and $Pr_2O_3$. Alternatively, the pixel defining film 114 may be formed so as to have a multi-layer structure in which an organic insulating material and an inorganic insulating material are alternately stacked.

The intermediate layer 112 is disposed between the first electrode 111 and the second electrode 113. The intermediate layer 112 maybe formed so as to have a single-layer structure or a multi-layer structure in which one or more layers selected from the group consisting of an organic emissive layer (EML), a hole transport layer (HTL), a hole injection layer (HIL), an electron transport layer (ETL), and an electron injection layer (EIL) are stacked.

The organic EML may include a low molecular weight or high molecular weight organic material.

If the organic EML is formed of a low molecular weight organic material, the intermediate layer 112 is configured such that the HTL and the HIL are stacked toward the first electrode 111 and the ETL and the EIL are stacked toward the second electrode 113 about the organic EML. If necessary, other various layers may be stacked. In this case, examples of the low molecular weight organic material may include copper phthalocyanine (CuPc), N,N'-Di(naphthalene-1-yl)-N, N'-diphenyl-benzidine (NPB), and tris-8-hydroxyquinoline aluminum (Alq3).

If the organic ELM is formed of a high molecular weight organic material, the intermediate layer 112 may include only the HTL stacked toward the first electrode 111 about the organic ELM. The HTL formed of poly(3,4-ethylenedioxythiophene) (PEDOT) or polyaniline (PANI) may be formed on the first electrode 111 by using inkjet printing or spin coating. Examples of the high molecular weight organic material may include polyphenylene vinylene (PPV)-based high molecular weight organic material and polyfluorene-based high molecular weight organic material. A color pattern may be formed by using a typical method such as inkjet printing, spin coating, or laser-induced thermal imaging.

A buffer layer 115 is formed on the second electrode 113. The buffer layer 115 protects the intermediate layer 112 from plasma damage or ultraviolet (UV) damage during a subsequent thin film process.

The encapsulation unit 120 seals the organic light-emitting unit 102. The encapsulation unit 120 includes one or more barrier layers 1211, 1221, and 1231 and planarization layers 1212b and 1222 that are stacked on the buffer layer 115.

Each of the barrier layers 1211, 1221, and 1231 may be formed of an inorganic material. For example, each of the barrier layers 1211, 1221, and 1231 may be formed of $AlO_x$, $Al_2O_3$, $SiN_x$, $Si_3N_4$, ZrO, or Al-doped zinc oxide (AZO). Each of the barrier layers 1211, 1221, and 1231 may include two or more layers formed of $AlO_x$, $Al_2O_3$, $SiN_x$, $Si_3N_4$, ZrO, or AZO. Each of the barrier layers 1211, 1221, and 1231 may be formed by using thermal evaporation, E-beam evaporation, radio frequency (RF) sputtering, reactive sputtering, or atomic layer deposition (ALD).

Each of the planarization layers 1212b and 1222 may be formed of an organic material. For example, each of the planarization layers 1212b and 1222 may be formed of an acrylic monomer, a silicon-based monomer, an epoxy-based monomer, or a polymer including the above monomers. Each of the planarization layers 1212b and 1222 formed of an acrylic monomer may be formed by using thermal evaporation. The thickness of each of the planarization layers 1212b and 1222 may be greater than the thickness of each of the barrier layers 1211, 1221, and 1231.

A cover layer 1212a may be formed between the barrier layer 1211 and the planarization layer 1212b. The cover layer 1212a is formed on the barrier layer 1211 so as to cover a crack C formed in the organic light-emitting device EL as shown in FIG. 3. When the intermediate layer 112 comes off the pixel defining film 114, the crack C occurs in the second electrode 113, the buffer layer 115, and the barrier layer 1211 formed on the intermediate layer 112 so as to expose a portion of the pixel defining film 114. When a liquid material of the planarization layer 1212b or a diffusible component of the planarization layer 1212b is introduced through the crack C when the planarization layer 1212b is formed, the cover layer 1212a prevents the organic light-emitting device EL, particularly, the intermediate layer 112 including the organic EML, from being damaged by entirely covering the crack C. Since the cover layer 1212a protects the intermediate layer 112 including the organic EML, dark spots may be prevented from being generated on the organic light-emitting device EL.

In particular, if the intermediate layer 112 is formed by using laser-induced thermal imaging, the intermediate layer 112 comes off often. Laser-induced thermal imaging is a method that laminates a donor film on an accepter substrate and emits a laser beam to the donor film so as to transfer a transfer layer of the donor film to the acceptor substrate. As a result, a transfer layer pattern is formed on the acceptor substrate so as to form an intermediate layer. When the donor film and the acceptor substrate are delaminated after the transfer layer is transferred, a portion of the transfer layer comes off the acceptor substrate, particularly, a pixel defining film.

Figure 4:
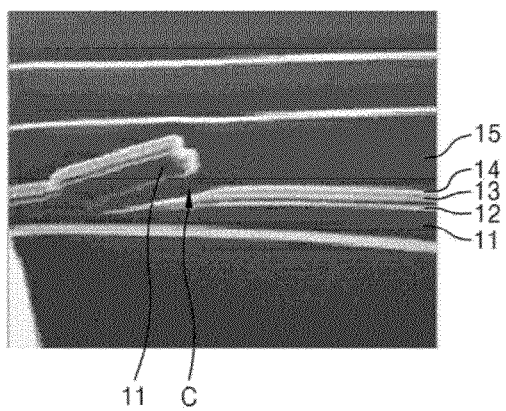
FIG. 4 is a cross-sectional image illustrating an organic light-emitting display device formed by using laser-induced thermal imaging and having a crack.

FIG. 4 is a cross-sectional image illustrating an organic light-emitting device formed by using laser-induced thermal imaging and having a crack.

Referring to FIG. 4, an intermediate layer 11 formed by transferring a transfer layer of a donor film comes off, and a cathode electrode 12, a buffer layer 13, and a barrier layer 14 sequentially formed on the intermediate layer 11 also come off, thereby resulting in a crack C. Once the crack C occurs, when a planarization layer 15 is formed, a material of the planarization layer 15 or a diffusible component discharged from the planarization layer 15 penetrates into the crack C so as to generate dark spots.

Figure 5:
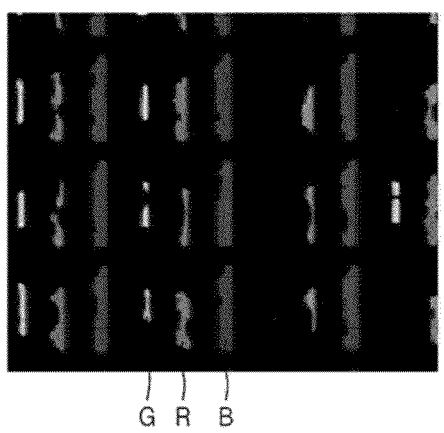
FIG. 5 is a cross-sectional image illustrating an organic light-emitting display device having dark spots.

FIG. 5 is a cross-sectional image illustrating an organic light-emitting device having dark spots.

The organic light-emitting device includes sub pixels R, G, and B on which dark spots are generated because the material of the planarization layer of FIG. 4 is introduced through the crack C. Referring to FIG. 5, an organic material penetrates into the sub pixels G and R, and thus light fails to be emitted.

The cover layer 1212a of FIGS. 2 and 3 is formed on the barrier layer 1211 so as to cover the crack C of the organic light-emitting device EL before the planarization layer 1212b is formed. The cover layer 1212a may be formed of an organic material, for example, an acrylic monomer, a silicon-based monomer, an epoxy-based monomer, or a polymer including the above monomers. The cover layer 1212a may be formed so as to have a thickness less than the thickness of the planarization layer 1212b. For example, the cover layer 1212a may have a thickness equal to or less than 1000 Å. The cover layer 1212a is coated on the barrier layer 1211 to a thickness great enough to cover the crack C, and is rapidly cured. For example, the organic material used to form the cover layer 1212a may be cured within about 15 seconds after being coated on the barrier layer 1211. As the thickness of the cover layer 1212a decreases and a speed at which the cover layer 1212a is cured increases, damage to the organic light-emitting device EL may be reduced due to the cover layer 1212a. As such, since the cover layer 1212a is formed to cover the crack C of the organic light-emitting device EL before the planarization layer 1212b is formed, dark spots generated on the organic light-emitting device EL when the planarization layer 1212b is introduced into the crack C while being formed may be minimized.

After the cover layer 1212a is cured, a multi-layer thin film process is performed. That is, the planarization layer 1212b is formed to cover the cover layer 1212a and the barrier layer 1221 is formed on the planarization layer 1212b. As shown in FIG. 2, the planarization layer 1222 and the barrier layer 1231 may be further formed on the barrier layer 1221.

While the present invention has been particularly shown and described with reference to exemplary embodiments thereof, it will be understood by those of ordinary skill in the art that various changes in form and detail may be made therein without departing from the spirit and scope of the present invention as defined by the following claims. Therefore, the scope of the invention is defined not by the detailed description of the invention but by the appended claims.

What is claimed is:

1. An organic light-emitting display device, comprising:
   a substrate;
   an organic light-emitting unit including a plurality of organic light-emitting devices formed on the substrate; and
   an encapsulation unit that seals the organic light-emitting unit, the encapsulation unit comprising:
   a barrier layer and a planarization layer stacked on the organic light-emitting unit, the planarization layer being made of an organic material; and
   a cover layer disposed between the barrier layer and the planarization layer for covering a crack occurring in each of the organic light-emitting devices, the cover layer being made of an organic material, the cover layer directly contacting the planarization layer.

2. The organic light-emitting display device of claim 1, wherein the cover layer has a thickness less than a thickness of the planarization layer.

3. The organic light-emitting display device of claim 1, wherein the barrier layer is formed of an inorganic material.

4. The organic light-emitting display device of claim 1, wherein the encapsulation unit comprises a plurality of the barrier layers and a plurality of the planarization layers, the barrier layers and the planarization layers being alternately stacked.

5. The organic light-emitting display device of claim 1, wherein the planarization layer is formed on the cover layer after the cover layer is cured.

6. The organic light-emitting display device of claim 5, wherein the cover layer is cured by using ultraviolet (UV) rays.

7. The organic light-emitting display device of claim 6, further comprising a buffer layer disposed between the organic light-emitting unit and the barrier layer, wherein the buffer layer protects the organic light-emitting device from the UV rays by blocking the UV rays when the cover layer is cured.

8. The organic light-emitting display device of claim 1, wherein the organic light-emitting device comprises:
   a first electrode formed on the substrate and exposed by a pixel defining film;
   an intermediate layer formed on the first electrode, the intermediate layer emitting light; and
   a second electrode formed to cover the intermediate layer.

9. The organic light-emitting display device of claim 8, wherein the crack occurs when the intermediate layer comes off the pixel defining film.

10. The organic light-emitting display device of claim 8, wherein the intermediate layer is formed by using laser-induced thermal imaging.

11. The organic light-emitting display device of claim 1, wherein the cover layer is formed of one selected from the group consisting of an acrylic monomer, a silicon-based monomer, an epoxy-based monomer, and a polymer including the above monomers.

12. A method of manufacturing an organic light-emitting display device, the method comprising the steps of:
   forming an organic light-emitting device on a substrate;
   forming a barrier layer that covers the organic light-emitting device;
   forming a cover layer on the barrier layer, the cover layer being made of an organic material; and
   forming a planarization layer on the cover layer, the planarization layer being made of an organic material, the cover layer directly contacting the planarization layer, wherein the cover layer is formed to cover a crack that occurs when the organic light-emitting device is formed.

13. The method of claim 12, wherein the cover layer has a thickness less than a thickness of the planarization layer.

14. The method of claim 12, wherein the barrier layer is formed of an inorganic material.

15. The method of claim 12, wherein the cover layer is formed of one selected from the group consisting of an acrylic monomer, a silicon-based monomer, an epoxy-based monomer and a polymer including the above monomers.

16. The method of claim 12, wherein the planarization layer is formed on the cover layer after the cover layer is cured.

17. The method of claim 16, wherein the cover layer is cured by using ultraviolet (UV) rays.

18. The method of claim 16, further comprising forming a buffer layer to cover the organic light-emitting device before the forming of the barrier layer.

19. The method of claim 18, wherein the cover layer is cured by using ultraviolet (UV) rays.

20. The method of claim 19, wherein the buffer layer protects the organic light-emitting device from the UV rays by blocking the UV rays when the cover layer is formed.

21. The method of claim 12, wherein the step of forming the organic light-emitting device comprises:
   forming a first electrode on the substrate;
   forming a pixel defining film that exposes a surface of the first electrode;
   forming an intermediate layer on the first electrode, the intermediate layer emitting light; and
   forming a second electrode on the intermediate layer.

22. The method of claim 21, wherein the crack occurs when the intermediate layer comes off the pixel defining film.

23. The method of claim 21, wherein the intermediate layer is formed by using laser-induced thermal imaging.

* * * * *